(12) United States Patent
Bhatt et al.

(10) Patent No.: US 8,138,826 B1
(45) Date of Patent: Mar. 20, 2012

(54) APPARATUS AND METHOD FOR COMPLETE ELIMINATION OF INPUT COUPLING CAPACITORS IN SIGNAL AMPLIFICATION

(75) Inventors: Ansuya P. Bhatt, Cupertino, CA (US); Raminder Jit Singh, San Jose, CA (US); Adam Abed, Sunnyvale, CA (US); David A. Beeson, Pleasanton, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 12/841,847

(22) Filed: Jul. 22, 2010

(51) Int. Cl.
*H03F 1/02* (2006.01)
(52) U.S. Cl. .......... 330/9; 330/253; 330/251; 330/207 A
(58) Field of Classification Search .............. 330/9, 253, 330/251, 207 A
See application file for complete search history.

(56) References Cited

U.S. PATENT DOCUMENTS

| | | | | |
|---|---|---|---|---|
| 5,677,561 A * | 10/1997 | Jensen | ................. | 257/469 |
| 6,035,049 A | 3/2000 | Engh et al. | | |
| 6,316,992 B1 * | 11/2001 | Miao et al. | ................. | 330/2 |
| 7,126,419 B2 * | 10/2006 | Miyasita | ................. | 330/69 |
| 7,135,920 B2 | 11/2006 | Koen et al. | | |
| 7,248,105 B2 | 7/2007 | Koen | | |
| 7,378,903 B2 * | 5/2008 | Bates | ................. | 330/9 |
| 7,532,065 B2 * | 5/2009 | Chen et al. | ................. | 330/9 |
| 7,589,587 B2 * | 9/2009 | Yoshida et al. | ................. | 330/9 |
| 7,692,488 B2 * | 4/2010 | Wong et al. | ................. | 330/251 |
| 7,695,085 B2 * | 4/2010 | Bae et al. | ................. | 347/10 |

OTHER PUBLICATIONS

LM48824 Class G Headphone Amplifier with I2C Volume Control; Boomer Audio Power Amplifier Series: National Semiconductor; Aug. 31, 2009.

\* cited by examiner

*Primary Examiner* — Patricia Nguyen
(74) *Attorney, Agent, or Firm* — Frommer Lawrence & Haug LLP; Matthew M. Gaffney

(57) ABSTRACT

A circuit and method for signal amplification is provided. The circuit includes an amplifier including an input amplifier that is arranged to receive an input analog signal, and to provide an input amplifier output signal by amplifying the input analog signal. The amplifier further includes a DC offset correction circuit that is arranged to determine a DC offset correction for the input amplifier each time the amplifier is powered up. The DC offset correction is performed by iteratively adjusting a DC offset of the input amplifier until the input amplifier output DC offset is zero when the input analog AC signal is zero, within a predetermined tolerance. The DC offset correction circuit is further arranged to provide the determined DC offset correction to the input amplifier during operation of the amplifier.

13 Claims, 7 Drawing Sheets

APPARATUS AND METHOD FOR COMPLETE ELIMINATION OF INPUT COUPLING CAPACITORS IN SIGNAL AMPLIFICATION

FIELD OF THE INVENTION

The invention is related to signal amplification, and in particular, to an apparatus and method for signal amplification in which the need to use input coupling capacitors is completely eliminated.

BACKGROUND OF THE INVENTION

In many signal amplification application, including audio amplification applications, external AC coupling capacitors are used to prevent large DC offsets. These large DC offsets can have a negative impact on chip performance. As a specific example, in audio applications these DC offsets have the negative effect of creating audible clicks and pops during startup and shutdown. Without coupling capacitors, the "click and pop" performance significantly deteriorates as the signal path gain of the audio chip increases.

While utilizing AC coupling capacitors has been a viable solution to preventing DC offsets, these capacitors have the negative effect of consuming large amounts of printed circuit board (PCB) space, increasing component cost, and degrading low frequency performance. As a point of comparison, a typical AC coupling capacitor for a typical analog chip is approximately the size of the entire chip itself.

As current audio systems grow more complex, additional AC coupling capacitors are needed. In newer audio systems the PCB space consumed by capacitors can be as high as five to ten times the PCB space consumed by the audio chip.

BRIEF DESCRIPTION OF THE DRAWINGS

Non-limiting and non-exhaustive embodiments of the present invention are described with reference to the following drawings, in which.

DETAILED DESCRIPTION

Figure 1:
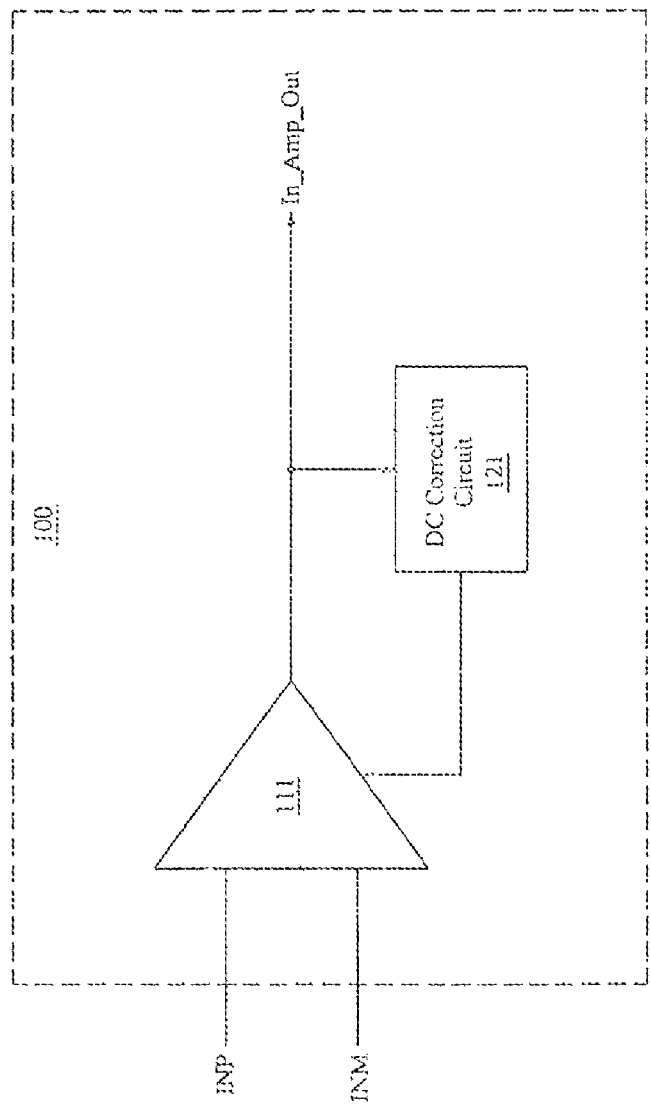
FIG. 1 illustrates a block diagram of a circuit for signal amplification.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. Similarly, the phrase "in some embodiments," as used herein, when used multiple times, does not necessarily refer to the same embodiments, although it may. As used herein, the term "or" is an inclusive "or" operator, and is equivalent to the term "and/or," unless the context clearly dictates otherwise. The term "based, in part, on", "based, at least in part, on", or "based on" is not exclusive and allows for being based on additional factors not described, unless the context clearly dictates otherwise. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal. Where either a field effect transistor (FET) or a bipolar junction transistor (BJT) may be employed as an embodiment of a transistor, the scope of the words "gate", "drain", and "source" includes "base", "collector", and "emitter", respectively, and vice versa.

Briefly stated, the invention is related to a circuit and method for signal amplification. The circuit includes an amplifier including an input amplifier that is arranged to receive an input analog signal, and to provide an input amplifier output signal by amplifying the input analog signal. The amplifier further includes a DC offset correction circuit that is arranged to determine a DC offset correction for the input amplifier each time the amplifier is powered up. The DC offset correction is performed by iteratively adjusting a DC offset of the input amplifier until the input amplifier output DC offset is zero when the input analog AC signal is zero, within a predetermined tolerance. The DC offset correction circuit is further arranged to provide the determined DC offset correction to the input amplifier during operation of the amplifier.

FIG. 1 illustrates a block diagram of amplifier 100, which may be employed for signal amplification. Amplifier 100 is arranged to provide an output analog signal (not shown in FIG. 1) by amplifying an input analog signal (INP/INM). Circuit 100 includes input amplifier 111 and DC correction circuit 121.

Input amplifier 111 is arranged to receive input analog signal INP/INM and to provide input amplifier output signal In_Amp_Out by amplifying input analog signal INP/INM.

DC offset correction circuit 121 is arranged to determine a DC offset correction for input amplifier 111 each time amplifier 100 is powered up. DC correction circuit 121 accomplishes this during each power up by iteratively adjusting the DC offset of input amplifier 111 until the DC offset of input amplifier output signal In_Amp_Out is zero when input analog AC signal INP/INM is zero, with a predetermined tolerance. During normal operation of amplifier 100, DC correction circuit 121 provides the determined DC offset correction to input amplifier 111, thereby substantially eliminating DC offset from input amplifier 111.

Amplifier 100 is arranged to provide an output analog signal (not shown in FIG. 1) based, at least in part, on input amplifier output signal In_Amp_Out.

Although input amplifier output signal In_Amp_Out is shown in FIG. 1 as a single-ended signal, in some embodiments within scope of the invention, signal In_Amp_Out is a differential signal. Further, although analog input signal INP/INM is shown as a differential signal, in other embodiments, the analog input signal may be a single-ended signal, with information about the common mode voltage also provided to amplifier 100.

Figure 2:
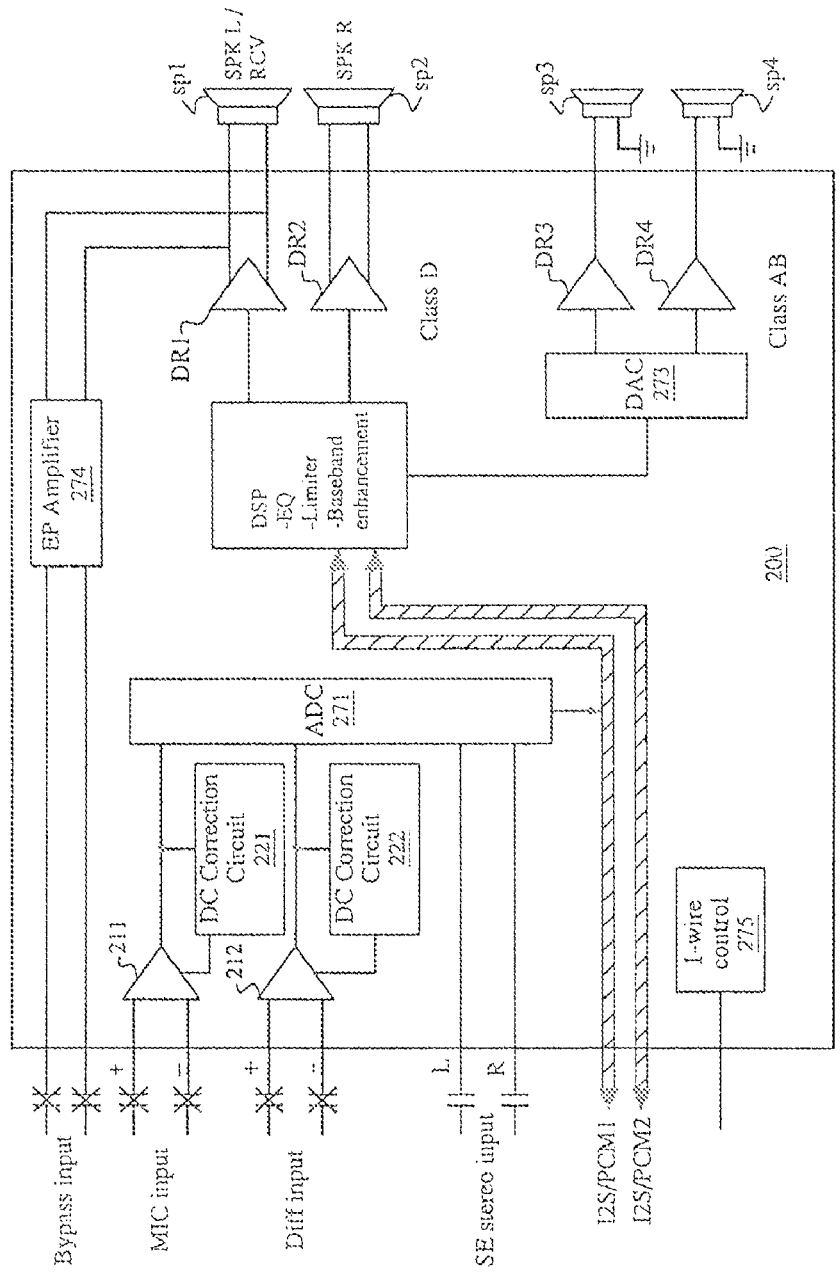
FIG. 2 shows a block diagram of an embodiment an audio amplifier that is an embodiment of the circuit of FIG. 1.

FIG. 2 shows a block diagram of an embodiment audio amplifier 200, which may be employed as an embodiment of amplifier 100 of FIG. 1. Audio amplifier 200 further includes input amplifier 212, DC correction circuit 222, analog-to-digital converter (ADC) 271, digital signal processor (DSP) 272, digital-to-analog converter (DAC) 273, earpiece (EP) amplifier 274, 1-wire control 275, drivers DR1-DR4, and speakers SP1-SP4.

As shown, input coupling capacitors can be eliminated from each of the differential inputs to audio amplifier 200. For each differential audio input, the wires can be coupled directly to the input ports rather than connected via input coupling capacitors. The single-ended stereo inputs may include input coupling capacitors in some embodiments, as illustrated. In other embodiments, the single-ended input(s) are used without coupling capacitors, and information about the common mode voltage of the single-ended inputs is provided to audio amplifier 200.

Input amplifiers 211 and 212 each operate in substantially the same manner as described above with regard to input amplifier 111, and DC correction circuits 221 and 222 each operate in substantially the same manner as described above with regard to DC correction circuit 121.

In the prior art, AC signal amplification requires one or more input coupling capacitors to block DC offset. These AC coupling capacitors are required in signal amplification applications so that any DC offset does not get amplified by the gain stages of the amplification. Input coupling capacitors are not needed to amplify a constant DC voltage, but are required for amplifying time-varying signals in the prior art, such as the amplification of audio signals, as one example. In contrast, aspects of the invention enable signal amplification while eliminating the requirement for input coupling capacitors to be used.

All audio amplifiers in the prior art use external input coupling caps and the number of inputs caps go up as the audio system complexity goes up. For example, a simple ceramic driver may need only two external capacitors, whereas a complex audio subsystem may need 5-6 external capacitors. It is undesirable to integrate these input coupling capacitors into the silicon, because of the increase in chip size that would result.

By reducing the need for input coupling capacitors, circuit 200 allows for a significant savings in printed circuit board space, which is particularly critical in portable applications, and savings in component cost while maintaining system performance and minimally impacting chip area, while also improving audio quality, allowing a faster turn-on time, and causing a better power supply rejection ratio and common mode rejection ratio at low frequency due to elimination of the input coupling capacitors. In audio amplification application, it allows for significantly better bass performance since lower frequencies are not being attenuated by input coupling capacitors.

Figure 3:
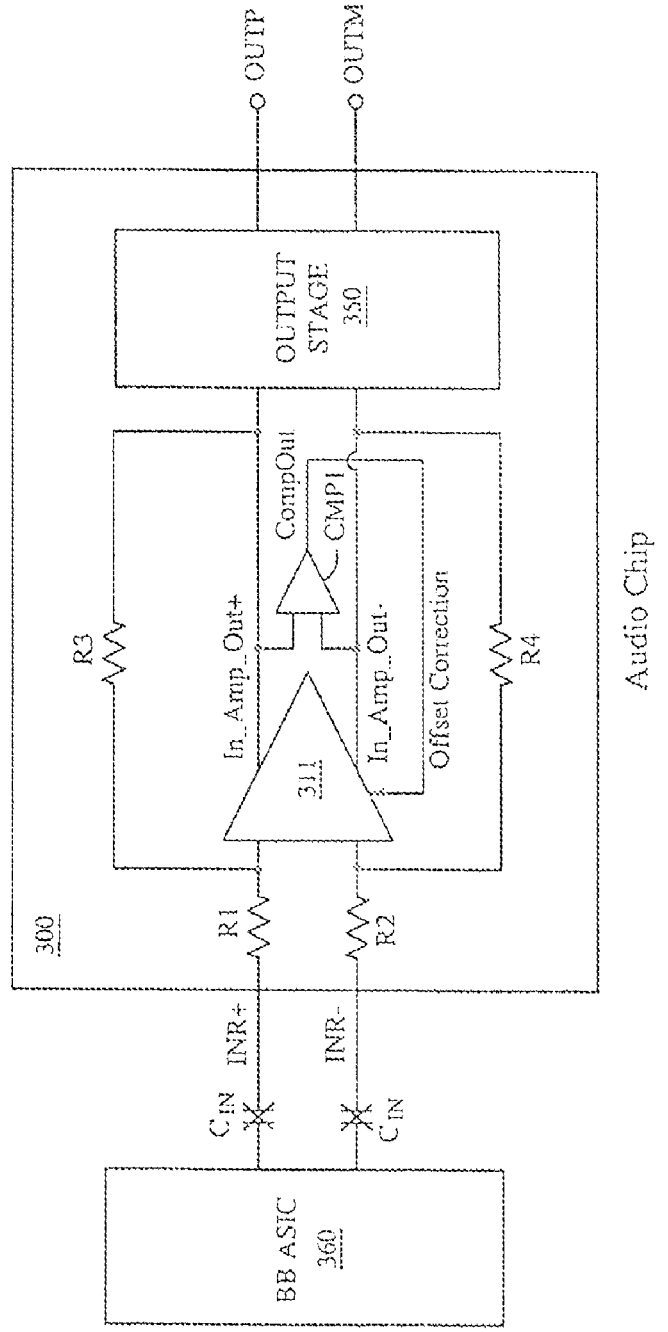
FIG. 3 illustrates a block diagram of an embodiment an audio amplifier integrated circuit that is an embodiment of the circuit of FIG. 1.

FIG. 3 illustrates a block diagram of an embodiment audio amplifier integrated circuit 300, which may be employed as an embodiment of circuit 100 of FIG. 1, and baseband (BB) application-specific integrated circuit (ASIC) 360. Audio amplifier integrated circuit 300 further includes comparator CMP1, resistors R1-R4, and output stage 350. Comparator CMP1 may be employed as at least a portion of DC offset correction circuit 121 of FIG. 1.

Amplifier 311 may be configured substantially as an op amp with an adjustable DC offset correction configured in a fully differential amplifier configuration in conjunction with resistors R1-R4. Comparator CMP1 is arranged to comparator differential input amplifier output signal In_Amp_Out+/In_Amp_Out−, and to provide signal CompOut in response to the comparison. Input amplifier 311 is arranged to have an adjustable DC offset that is adjusted, based at least in part, based on signal CompOut.

Output stage 350 is an output audio amplifier stage, such as a class AB output stage, class D output stage, and/or the like.

Although BB ASIC 360 is shown as an input source providing input differential audio signal INR+/INR−, substantially any off-chip source of an input audio signal to be amplified may be used in place of BB ASIC 360, which is shown only by way of example. The DC offset correction corrects for DC offset coming from the input source (e.g., BB ASIC 360), and DC offset caused by input amplifier 311 itself. It may be a system requirement for BB ASIC 360 to provide no AC signal during each power up so that the DC offset correction can be properly performed.

Figure 4:
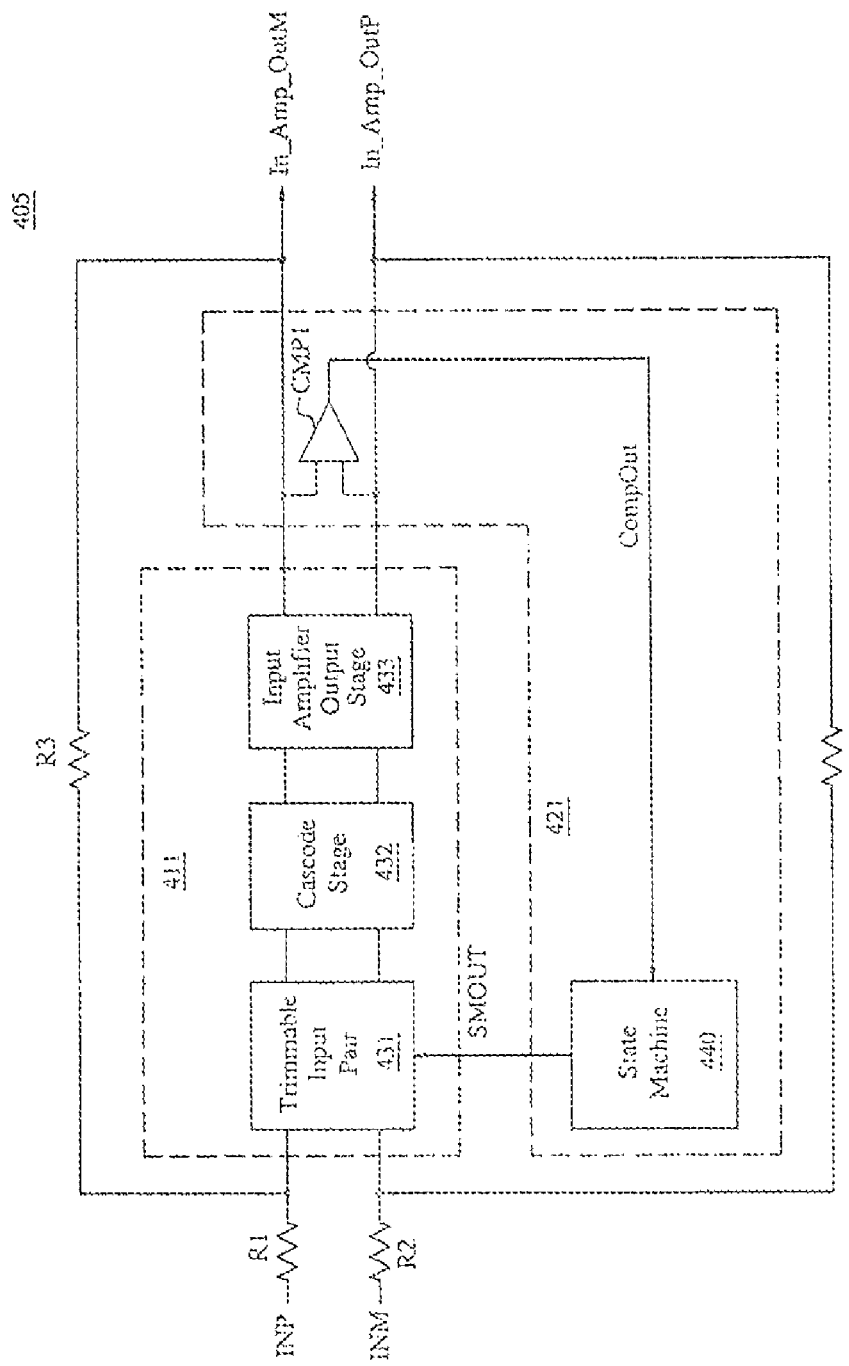
FIG. 4 shows a block diagram of an embodiment of a portion of an embodiment of the circuit of FIG. 1 or FIG. 3.

FIG. 4 shows a block diagram of an embodiment of a portion 405 of an embodiment of an amplifier, such as an embodiment of amplifier 100 of FIG. 1 or an embodiment of audio amplifier 300 of FIG. 3. Portion 405 includes input amplifier 411, resistors R1-R4, and DC offset correction circuit 421. DC offset correction circuit 421 includes comparator CMP1 and state machine 440. Input amplifier 411 includes trimmable input pair 431, cascode stage 432, and input amplifier output stage 433.

Trimmable input pair is an input pair with a strength that is adjustable based on state machine output signal SMOUT. Cascode stage 432 may be folded cascode, or the like. Input amplifier output stage 433 may be any suitable op amp output stage, such as a class AB output stage, or the like. Although not shown in FIG. 4, one or more additional gain stages may be included between cascode stage 432 and output stage 433, and/or cascode stage 432 may be replaced with a different type of gain stage, and/or the like.

State machine 440 is arranged to provide state machine output signal SMOUT, based, in part, on signal CompOut. Each time the amplifier is powered up, state machine 440 iteratively adjusts the DC offset of trimmable input pair 431 by providing signal SMOUT until input amplifier output signal In_Amp_OutP/In_Amp_OutM's DC offset is zero (within a predetermined tolerance) when audio input AC signal INP/INM is zero, as determined based on signal CompOut. For example, the predetermined tolerance may be selected to ensure a sufficiently low DC offset level to prevent an audible click/pop noise from occurring during startup of the amplifier.

For example, in some embodiments, state machine 440 and comparator CMP1 operate to determine the DC offset as follows. Comparator CMP1 has a relatively high gain so that any slight offsets in the amplifier or the input source of the audio signal (e.g., BB ASIC 360 of FIG. 3) cause comparator CMP1 to trip. State machine 440 skews the offset of input amplifier 441 by an amount slightly greater than the maximum expected un-calibrated offset (this will include input source offset and amplifier offset), by increasing the strength of the inverting side of the trimmable input pair. The comparator output should now be low since the inverting input is stronger than the non-inverting side. Next, state machine 440 reduces the strength of the inverting side, and waits tens of microseconds to see if the comparator output CompOut trips high. If CompOut does not trip high, state machine 440 repeats the process of reducing the inverting input's strength until the CompOut trips or the inverting side strength is reduced to the minimum. If the inverting side strength is reduced to the minimum, state machine 440 begins to increase the strength of the non-inverting input in the same manner until CompOut trips high. Signal CompOut trips high once the offset has been cancelled.

Once the DC offset has been determined during power-up, state machine 440 provides the determined DC offset to offset input amplifier 411 by this amount during normal operation of input amplifier 411.

Figure 5:
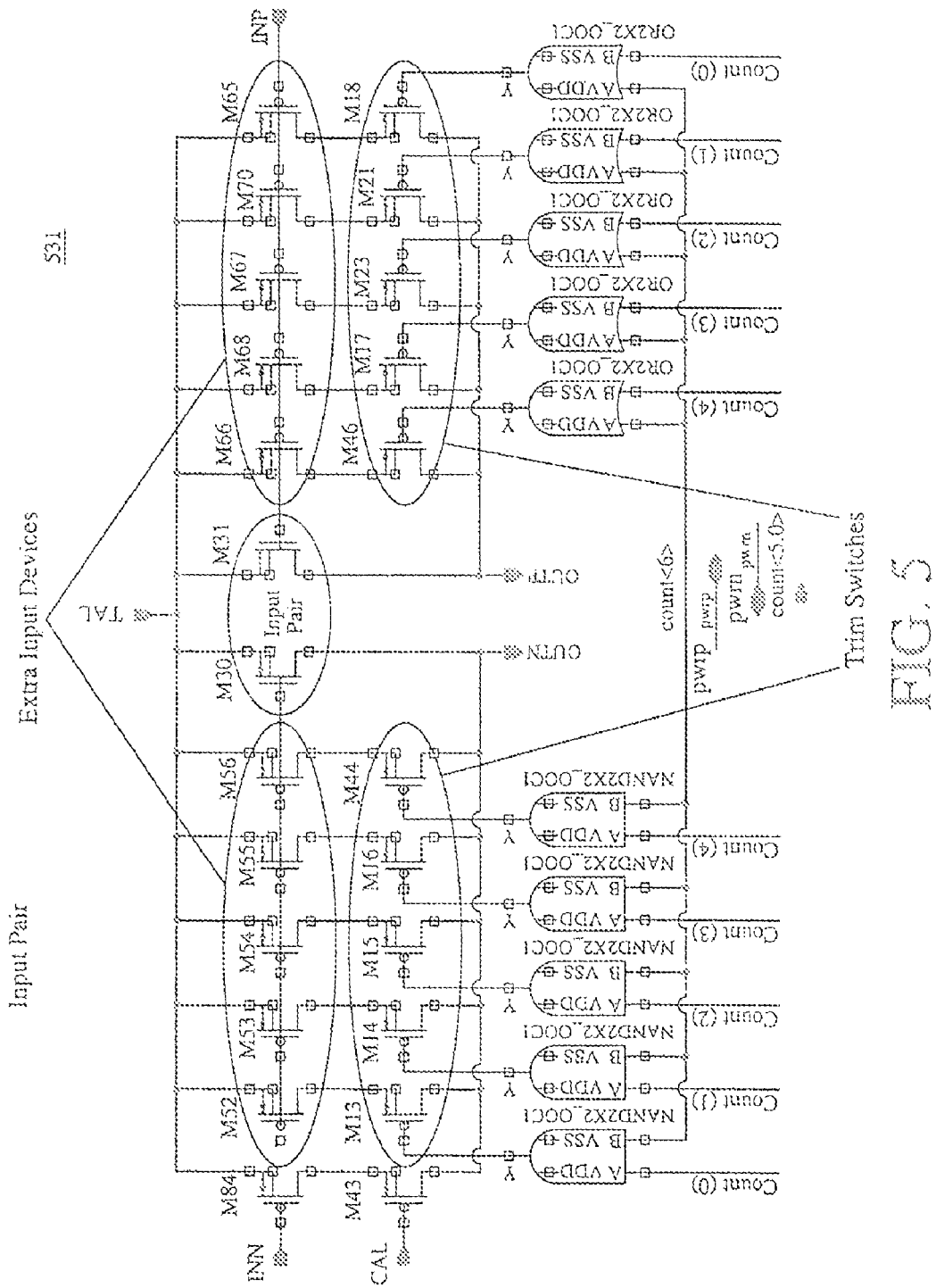
FIG. 5 schematically illustrates an embodiment of the trimmable input pair of FIG. 4.

FIG. 5 schematically illustrates an embodiment of trimmable input pair 531, which may be employed as an embodiment of trimmable input pair 431 of FIG. 4. Signals count<4:0> and CALN are an embodiment of state machine output signal SMOUT.

As shown in FIG. 5, trimmable input pair 531 includes a differential pair, extra input transistors on an inverting side of the differential pair, extra input transistor on a non-inverting side of the differential pair, and switches, including a separate switch coupled to each of the extra input transistors, where each of the switches is arranged to couple a corresponding one of the extra input transistor to the differential pair to adjust a strength of trimmable input pair 431.

Figure 6A:
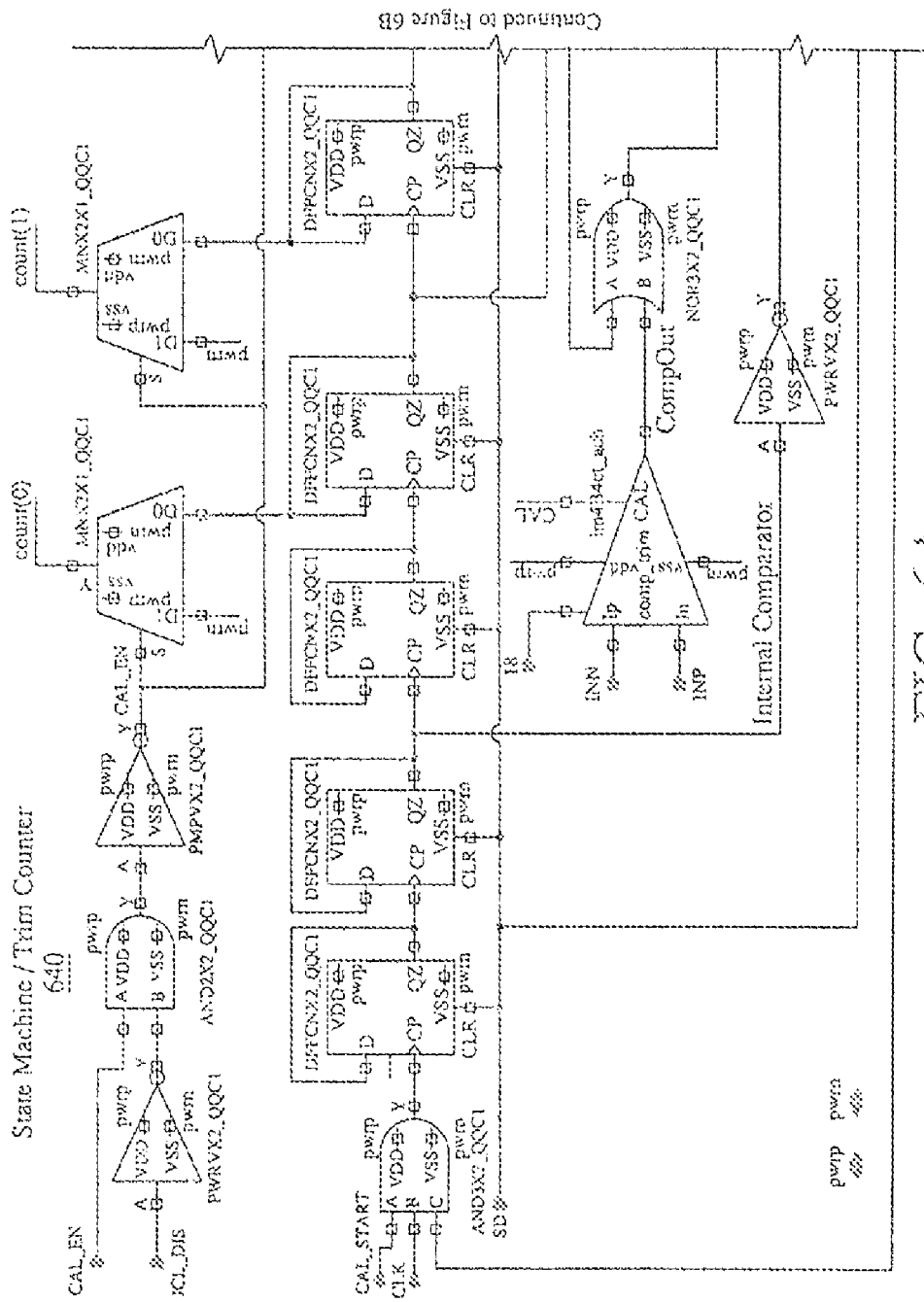
FIG. 6 shows a schematic diagram of an embodiment of the state machine of FIG. 4, arranged in accordance with aspects of the invention.
Figure 6B:
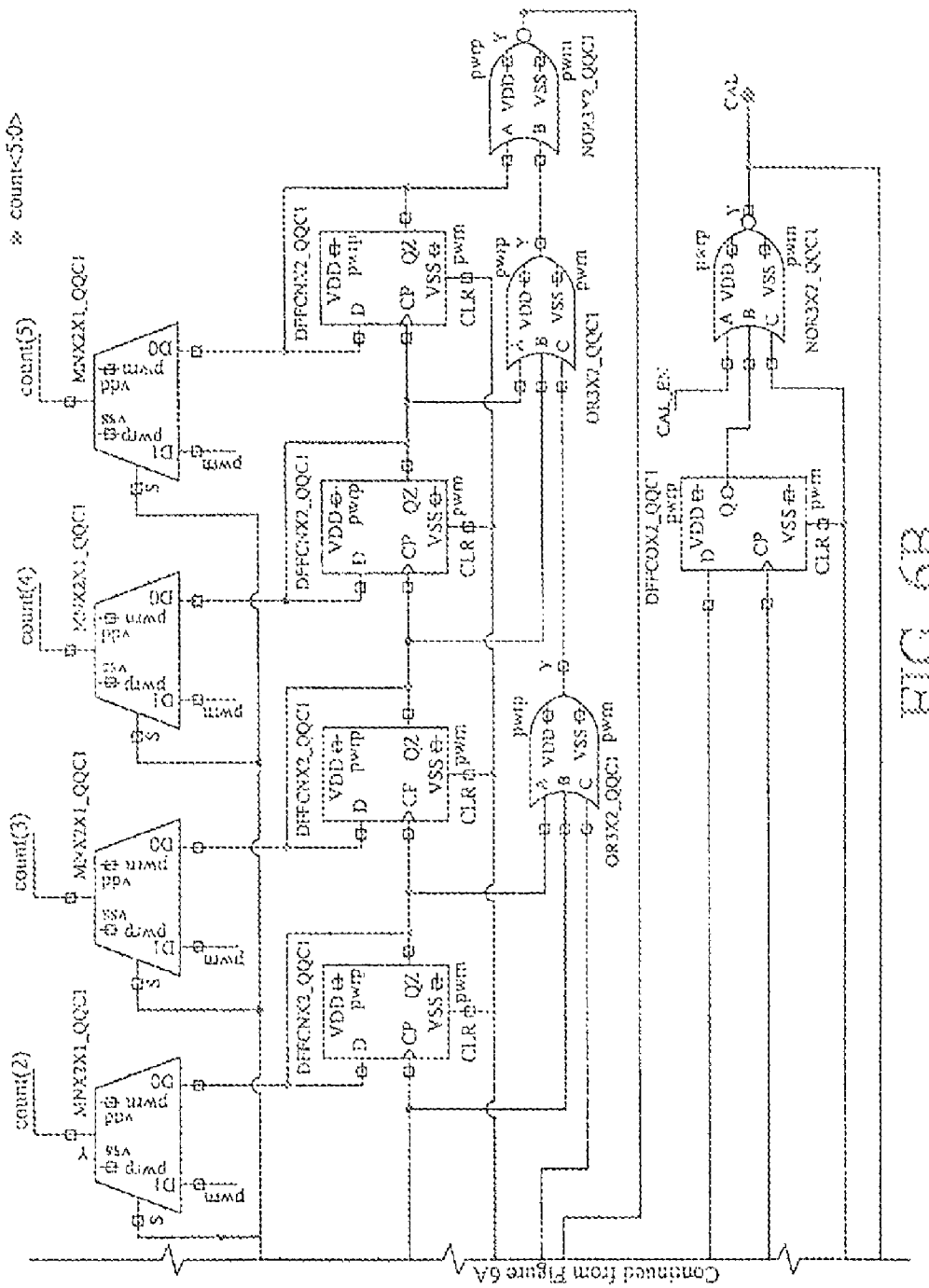

FIG. 6 shows a schematic diagram of an embodiment of state machine 640, which may be employed as an embodiment of state machine 440 of FIG. 4.

As shown, state machine 640 is arranged to skew the offset of the input amplifier 411 to one side by an amount slightly greater than the maximum expected un-calibrated offset, by adding extra input transistors to the inverting side of the amplifier's differential pair. The comparator output CompOut should now be low since the inverting input is stronger than the non-inverting side. State machine 640 then causes the removal one of the extra devices from the inverting side to reduce its strength, and then waits tens of microseconds to see if the comparator output trips high. If CompOut does not trip high, state machine 640 repeats the process of reducing the inverting input's strength until the comparator output trips or until all of the extra devices are removed. If all the extra devices are removed from the inverting input, state machine 640 begins to cause the adding of devices onto the non-inverting input in the same manner until the comparator output trips high. The comparator will trip high once the DC offset has been cancelled. When this happens, state machine 640 reconfigures input 411 amplifier back into its normal mode of operation.

Although a particular way of adjusting the DC offset was discussed above, in other embodiments, the DC offset correction may be accomplished in different ways. For example, rather than adding or subtracting transistors to the input pair, DC offset correction may instead be accomplished by adding or subtracting current, or the like. A substantially similar DC offset correction method may be performed in this way. These embodiments and others are within the scope and spirit of the invention.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A circuit for signal amplification, comprising:
an amplifier that is arranged to perform signal amplification to provide an output analog signal by amplifying an input analog signal, wherein the amplifier includes:
an input amplifier that is arranged to receive the input analog signal, and provide an input amplifier output signal by amplifying the input analog signal; and
a DC offset correction circuit that is arranged to determine a DC offset correction for the input amplifier each time the amplifier is powered up by iteratively adjusting a DC offset of the input amplifier until the DC offset is zero when the input analog signal is zero, within a predetermined tolerance, and to provide the determined DC offset correction to the input amplifier during operation of the amplifier.

2. The circuit of claim 1, wherein
the input amplifier includes an input pair, and
wherein the DC offset correction circuit includes:
a comparator that is arranged to receive the input amplifier output signal each time the amplifier is powered up, and to provide a comparator output signal; and
a state machine that is arranged to receive the comparator output signal, and to iteratively adjust the DC offset of the input amplifier until the DC offset is zero when the input analog signal is zero by iteratively adjusting a strength of the input pair in the input amplifier.

3. The circuit of claim 1, wherein
the input amplifier is a differential input amplifier, and
wherein the input analog signal is a differential signal.

4. The circuit of claim 1, wherein the amplifier further includes:
a class AB output stage.

5. The circuit of claim 1, wherein the amplifier further includes:
a class D output stage.

6. The circuit of claim 1, wherein
the predetermined tolerance is sufficiently low that no audible click/pop noise occurs due to DC offset while the amplifier is powering up.

7. The circuit of claim 1, wherein the amplifier does not require any input coupling capacitors.

8. The circuit of claim 1, wherein
the input amplifier includes a trimmable input pair.

9. The circuit of claim 8, wherein
the trimmable input pair includes:
a differential pair;
a plurality of extra input transistors on an inverting side of the differential pair;
a plurality of extra input transistor on a non-inverting side of the differential pair; and
a plurality of switches, including a separate switch coupled to each of the extra input transistors, wherein each of the plurality of switches is arranged to couple a corresponding one of the extra input transistor to the differential pair to adjust a strength of the trimmable input pair.

10. A method for signal amplification, comprising:
employing an input amplifier to provide an input amplifier output signal by amplifying an input analog signal;
each time the input amplifier is powered up, iteratively adjusting a DC offset of the input amplifier until the DC offset is zero when the input analog signal is zero, within a predetermined tolerance; and
providing the determined DC offset correction to the input amplifier during operation of the input amplifier.

11. The method of claim 10, wherein the input amplifier is a differential input amplifier, and wherein the input analog signal is a differential signal.

12. The method of claim 10, wherein the predetermined tolerance is sufficiently low that no audible click/pop noise occurs due to DC offset while the amplifier is powering up.

13. The method of claim 10, wherein iteratively adjusting the DC offset of the input amplifier includes iteratively adjusting a strength of an input pair in the input amplifier.

* * * * *